(12) United States Patent
Kao et al.

(10) Patent No.: US 11,387,159 B2
(45) Date of Patent: Jul. 12, 2022

(54) CHIP PACKAGE

(71) Applicant: Industrial Technology Research Institute, Hsinchu (TW)

(72) Inventors: Kuo-Shu Kao, Hsinchu (TW); Tao-Chih Chang, Taoyuan (TW); Wen-Chih Chen, Hsinchu County (TW); Tai-Jyun Yu, Taoyuan (TW); Po-Kai Chiu, Taoyuan (TW); Yen-Ting Lin, Hsinchu (TW); Wei-Kuo Han, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/808,369

(22) Filed: Mar. 4, 2020

(65) Prior Publication Data

US 2020/0203246 A1  Jun. 25, 2020

Related U.S. Application Data

(62) Division of application No. 15/976,886, filed on May 11, 2018.

(Continued)

(30) Foreign Application Priority Data

Dec. 27, 2017 (TW) .................................. 106146106

(51) Int. Cl.
*H01L 23/367* (2006.01)
*H01L 23/373* (2006.01)
(Continued)

(52) U.S. Cl.
CPC ........ *H01L 23/367* (2013.01); *H01L 23/3157* (2013.01); *H01L 23/3731* (2013.01);
(Continued)

(58) Field of Classification Search
CPC ............... H01L 23/367; H01L 23/3157; H01L 23/3731; H01L 23/4334; H01L 23/4951;
(Continued)

(56) References Cited

U.S. PATENT DOCUMENTS 5,434,449 A * 7/1995 Himeno .............. H01L 23/4334
257/690
6,225,701 B1 * 5/2001 Hori .................... H01L 23/4334
257/677

(Continued)

FOREIGN PATENT DOCUMENTS

| CN | 103178034 | 6/2013 |
| CN | 106463420 | 2/2017 |

(Continued)

OTHER PUBLICATIONS

"Office Action of Japan Counterpart Application", dated Sep. 15, 2020, p. 1-p. 4.

(Continued)

*Primary Examiner* — Peniel M Gumedzoe
(74) *Attorney, Agent, or Firm* — JCIPRNET

(57) ABSTRACT

A chip package including a lead frame, a first chip, a heat dissipation structure, and an insulating encapsulant is provided. The lead frame includes a chip pad having a first surface and a second surface opposite to the first surface and a lead connected to the chip pad. The first chip is disposed on the first surface of the chip pad and electrically connected to the lead of the lead frame and to the outside of the insulating encapsulant via the lead. The head dissipation structure is disposed on the second surface of the chip pad and includes a thermal interface material layer attached to the second surface. The insulating encapsulant encapsulates the first chip, the heat dissipation structure, and a portion of the lead frame.

8 Claims, 7 Drawing Sheets

Related U.S. Application Data

(60) Provisional application No. 62/568,803, filed on Oct. 6, 2017.

(51) Int. Cl.
*H01L 23/495* (2006.01)
*H01L 23/31* (2006.01)
*H01L 23/433* (2006.01)

(52) U.S. Cl.
CPC ...... *H01L 23/4334* (2013.01); *H01L 23/4951* (2013.01); *H01L 23/49531* (2013.01); *H01L 23/49575* (2013.01); *H01L 23/49586* (2013.01); *H01L 23/3121* (2013.01); *H01L 2224/26175* (2013.01); *H01L 2224/48091* (2013.01); *H01L 2224/48137* (2013.01); *H01L 2224/73265* (2013.01); *H01L 2924/181* (2013.01)

(58) Field of Classification Search
CPC ......... H01L 23/49531; H01L 23/49575; H01L 23/49586; H01L 23/3121; H01L 224/26175; H01L 224/48091; H01L 224/48137; H01L 224/73265; H01L 2924/181
See application file for complete search history.

(56) References Cited

U.S. PATENT DOCUMENTS

| | | | | |
|---|---|---|---|---|
| 2006/0056213 | A1* | 3/2006 | Lee | H01L 25/162 363/144 |
| 2007/0240899 | A1* | 10/2007 | Sakamoto | H01L 21/565 174/252 |
| 2015/0214199 | A1 | 7/2015 | Kim et al. | |

FOREIGN PATENT DOCUMENTS

| | | |
|---|---|---|
| JP | H05182996 | 7/1993 |
| JP | 2002246515 | 8/2002 |
| JP | 2003124400 | 4/2003 |
| JP | 2011054889 | 3/2011 |
| JP | 2011198864 | 10/2011 |
| JP | 2013069910 | 4/2013 |
| JP | 2013070026 | 4/2013 |
| JP | 2013118353 | 6/2013 |
| JP | 2016207805 | 12/2016 |

OTHER PUBLICATIONS

"Office Action of Japan Counterpart Application", dated Feb. 16, 2021, p. 1-p. 3.
"Office Action of China Counterpart Application", dated Jun. 9, 2020, p. 1-p. 11.

* cited by examiner

CHIP PACKAGE

CROSS-REFERENCE TO RELATED APPLICATION

This application is a divisional application of and claims the priority benefit of U.S. application Ser. No. 15/976,886, filed on May 11, 2018, now allowed, which claims the priority benefits of Taiwan application serial no. 106146106, filed on Dec. 27, 2017, and U.S. provisional application Ser. No. 62/568,803, filed on Oct. 6, 2017. The entirety of each of the above-mentioned patent applications is hereby incorporated by reference herein and made a part of this specification.

TECHNICAL FIELD

The disclosure relates to a package structure, and more particularly, to a chip package.

BACKGROUND

The drive system chip and power module chip of a compressor or a motor control system in a traditional frequency appliance are mostly encapsulated using a discrete-type device, and then a single package device is assembled in a system board. To increase the power density of the power device and achieve the demand of low cost, an integrated or intelligent power module (IPM) has gradually been developed in which a plurality of semiconductor devices is combined in one package structure so as to provide high output power in a package structure with a small volume to increase the power density. For such integrated power module, the heat dissipation properties of the power module are very significant.

The current integrated power modules mostly adopt a direct bond copper (DBC) ceramic substrate or direct plated copper (DPC) ceramic substrate for insulation and heat dissipation pathways. However, the ceramic material thickness in the DBC/DPC substrates is about 0.385 mm to 0.635 mm, and the thermal resistance of the power module may not be effectively reduced due to the greater thickness, such that the heat dissipation performance of the power module is affected.

SUMMARY

The disclosure provides a chip package including a lead frame, a first chip, a heat dissipation structure, and an insulating encapsulant. The lead frame includes a chip pad and a lead connected to the chip pad, wherein the chip pad has a first surface and a second surface opposite to the first surface. The first chip is disposed on the first surface of the chip pad and electrically connected to the lead of the lead frame. The head dissipation structure is disposed on the second surface of the chip pad and includes a thermal interface material layer attached to the second surface of the chip pad. The thermal interface material layer has a thermal conductivity between 3 W/mK and 15 W/mK and a thickness between 100 μm and 300 μm. The insulating encapsulant encapsulates the first chip, the heat dissipation structure, and a portion of the lead frame, and exposes the lead of the lead frame. The first chip is electrically connected to the outside of the insulating encapsulant via the lead.

The disclosure provides a chip package including a lead frame, a chip, a heat dissipation stack structure, and an insulating encapsulant. The lead frame has a first surface and a second surface opposite to the first surface. The lead frame includes a lead. The chip is disposed on the first surface of the lead frame and electrically connected to the lead frame. The heat dissipation stack structure is disposed on the second surface of the lead frame. The heat dissipation stack structure includes a first thermal interface material layer and a second thermal interface material layer. The first thermal interface material layer includes a top surface facing the chip. The second thermal interface material layer is located between the lead frame and the first thermal interface material layer and covers the top surface of the first thermal interface material layer. The second thermal interface material layer includes a top surface connected to the second surface of the lead frame and a bottom surface opposite to the top surface. The area of the top surface of the first thermal interface material layer is equal to the area of the bottom surface of the second thermal interface material layer and greater than the area of the top surface of the second thermal interface material layer. The insulating encapsulant encapsulates the chip, the heat dissipation stack structure, and the lead frame, wherein the lead of the lead frame is extended out from within the insulating encapsulant.

The disclosure provides a chip package including a chip, a chip carrier, a heat dissipation stack structure, and an insulating encapsulant. The chip carrier carries the chip and is electrically connected to the chip. The heat dissipation stack structure is located at a side of the chip carrier opposite to a side carrying the chip. The heat dissipation stack structure includes a first thermal interface material layer, a second thermal interface material layer, and a third thermal interface material layer. The second thermal interface material layer is stacked on the first thermal interface material layer. The third thermal interface material layer is stacked on the second thermal interface material layer and located between the chip carrier and the second thermal interface material layer. The material of the second thermal interface material layer is different from the material of the first thermal interface material layer and the material of the third thermal interface material layer. The insulating encapsulant encapsulates the chip, the heat dissipation stack structure and the chip carrier, and exposes a portion of the chip carrier.

The disclosure provides a chip package including a heat-dissipating device, a thermal interface material layer, a patterned circuit layer, a chip, and an insulating encapsulant. The thermal interface material layer is disposed on the heat-dissipating device. The thermal interface material layer has a thermal conductivity between 3 W/mK and 15 W/mK and a thickness between 100 μm and 300 μm. The patterned circuit layer is disposed on the thermal interface material layer. The thermal interface material layer is located between the patterned circuit layer and the heat-dissipating device. The chip is disposed on the patterned circuit layer and electrically connected to the patterned circuit layer. The insulating encapsulant encapsulates the chip, the patterned circuit layer, and the thermal interface material layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

First Embodiment

Figure 1A:
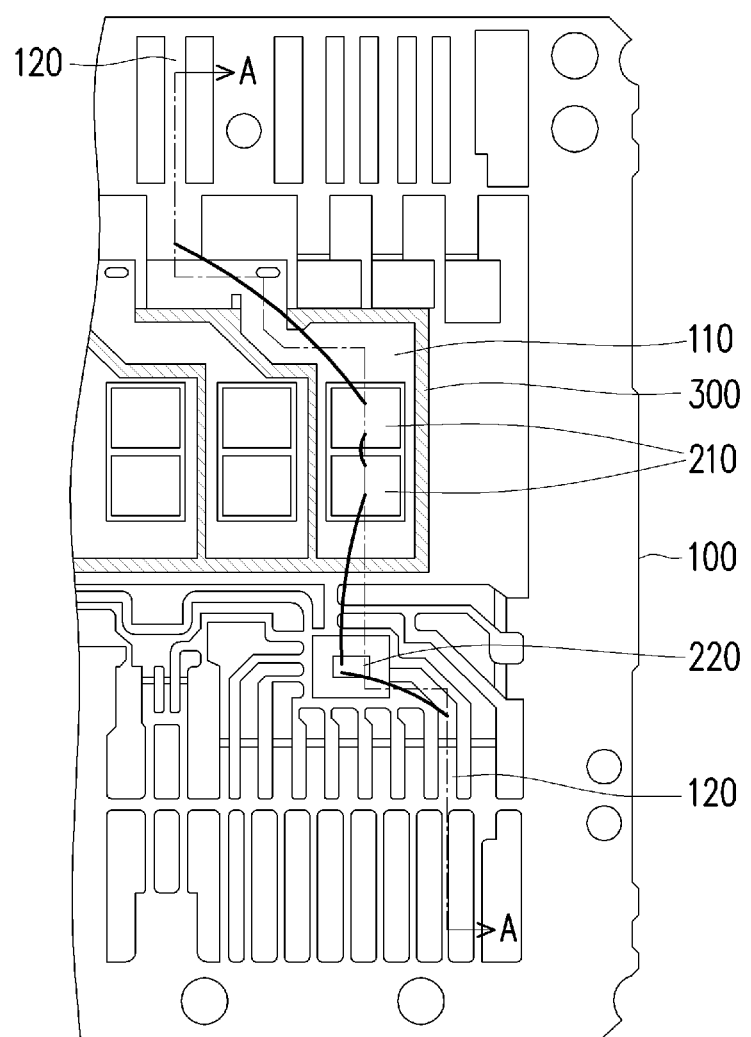
FIG. 1A is a schematic plan view of a lead frame and a chip in a chip package according to the first embodiment of the disclosure.
Figure 1B:
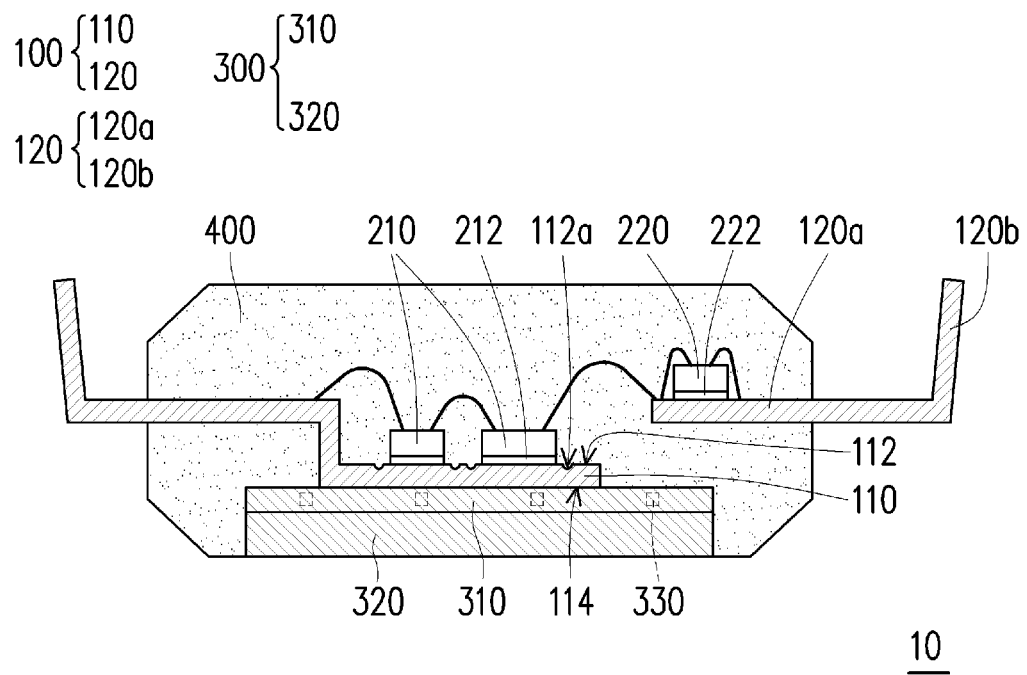
FIG. 1B is a schematic cross-section of a chip package according to the first embodiment of the disclosure.

FIG. 1A is a schematic plan view of a lead frame and a chip in a chip package according to the first embodiment of the disclosure, and FIG. 1B is a schematic cross-section of a chip package according to the first embodiment of the disclosure. Referring to FIG. 1A and FIG. 1B, a chip package 10 of the present embodiment may include a lead frame 100, a first chip 210, a heat dissipation structure 300, and an insulating encapsulant 400. It should be understood that, in the schematic plan view of FIG. 1A, to show the configuration between the lead frame and the chip, the insulating encapsulant encapsulating the lead frame and the chip is not illustrated. The insulating encapsulant is configured as shown in the schematic cross-section of FIG. 1B, and FIG. 1B is, for instance, a schematic cross-section along the dash line A-A in FIG. 1A. The lead frame 100 includes a chip pad 110 and a lead 120 connected to the chip pad 110.

The material of the lead frame 100 may include a suitable metal material such as aluminum, copper, or the like. In some embodiments, the lead frame may include a chip carrier, an insulated metal substrate or a patterned circuit layer, and the detail will be described later in other embodiments. The chip pad 110 of the lead frame 100 has a first surface 112 and a second surface 114 opposite to the first surface 112. The first chip 210 is disposed on the first surface 112 of the chip pad 110 and electrically connected to the lead 120 of the lead frame 100. The first chip 210 is electrically connected to the outside of the insulating encapsulant 400 via the lead 120. The lead 120 includes an inner lead 120a and an outer lead 120b having an end connected to the inner lead 120a. For instance, the other end of the outer lead 120b not connected to the inner lead 120a may be extended toward the thickness direction of the insulating encapsulant 400 and kept away from the inner lead 120a. The insulating encapsulant 400 encapsulates the chip pad 110 of the lead frame 100 and is connected to the inner lead 120a of the chip pad 110 and exposes the outer lead 120b. In some embodiments, the lead frame 100 may have a plurality of leads 120 surrounding the chip pad 110, and the leads 120 and the chip pad 110 are located at different levels. In other words, the chip pad 110 and the leads 120 of the lead frame 100 may be disposed in a concave manner.

In some embodiments, the material of the first chip 210 may include silicon, silicon carbide, gallium nitride, or the like, but the embodiments of the disclosure are not limited thereto. For instance, the first chip 210 may be mounted on the chip pad 110 via a connecting material 212. For instance, the connecting material 212 may be conductive, such as solder, silver paste, copper paste, silver glue, copper glue, etc. During the operation of the first chip 210, the resulting heat of the first chip 210 may be transferred to the lead frame 100 and the heat dissipation structure 300 via the connecting material 212. In some embodiments, the connecting material 212 may include an insulating adhesive material containing organic silicon groups or epoxy groups. In some embodiments, the first surface 112 of the chip pad 110 is provided with a groove 112a, and the first chip 210 is, for instance, located in a region defined by the groove 112a. In other words, the groove 112a may surround the first chip 210. In some embodiments, a plurality of grooves 112a not connected to one another may be provided and arranged in the periphery of the first chip 210. The grooves 112a may collect an excess of adhesive material from the process of adhering the first chip 210 to the chip pad 110 to prevent the adhesive material from contaminating other regions of the chip pad 110.

In the cross-section shown in FIG. 1B, the groove 112a is U-shaped. In other embodiments, the groove 112a may be V-shaped, a square groove, or other suitable shapes. In other embodiments, the groove 112a may be a whole-piece groove, and the first chip 210 is, for instance, located in the whole-piece groove 112a. The embodiments of the disclosure do not limit the size of the groove 112a, but a groove 112a having a greater depth may reduce the structural integrity of the chip pad 110. Therefore, the size of the groove 112a may be determined according to the degree and type of stress that may be applied to the chip package 10 and other design requirements.

In some embodiments, the first chip 210 is electrically connected to the lead frame 100 via a wire bonding process. For instance, the lead (such as the thick solid line in FIG. 1A and FIG. 1B) may be an aluminum wire, silver wire, copper wire, aluminum band, silver band, copper band, copper pad, or the like. In other embodiments, the first chip 210 may also be electrically connected to the lead frame 100 via a flip-chip bonding process. In some embodiments, the first chip 210 may be a power chip, such as an insulated-gate bipolar transistor (IGBT), a metal-oxide semiconductor field-effect transistor (MOSFET), or a diode, etc. The chip package 10 shown in FIG. 1A and FIG. 1B includes two first chips 210. It should be understood that, the quantity of the first chip 210 is only exemplary, and the quantity and location of the first chips 210 may be modified according to design requirement.

The heat dissipation structure 300 of the chip package 10 is, for instance, disposed on the second surface 114 of the chip pad 110. The heat dissipation structure 300 includes a thermal interface material (TIM) layer 310. In some embodiments, the thermal interface material layer 310 is attached onto the second surface 114 of the chip pad 110 to dissipate the heat generated from the operation of the first chip 210 to the outside. In some embodiments, the width of the thermal interface material layer 310 may be greater than the width of the chip pad 110. In other embodiments, the width of the thermal interface material layer 310 may be equal to or smaller than the width of the chip pad 110. For instance, the thickness of the thermal interface material layer 310 may be between 100 µm and 300 µm. The thermal interface material layer 310 has the material characteristics of low thermal resistance, high thermal conductivity, and high electrical insulation. For instance, the material of the thermal interface material layer 310 may include silicon, silicon dioxide ($SiO_2$), aluminum oxide ($Al_2O_3$), aluminum nitride (AlN), boron nitride (BN), or other suitable materials. In some embodiments, the thermal conductivity of the thermal interface material layer 310 is between 3 W/mK and 15 W/mK.

In some embodiments, the heat dissipation structure 300 further includes a heat-dissipating device 320. The heat-dissipating device 320 may be encapsulated in the insulating encapsulant 400. The thermal interface material layer 310 may be disposed between the heat-dissipating device 320 and the chip pad 110 to fill the bonding gap between the chip pad 110 and the heat-dissipating device 320 to expand the heat dissipation area between the chip pad 110 and the heat-dissipating device 320, thereby sufficiently exploiting the function of the heat-dissipating device 320. The material of the heat-dissipating device 320 may include aluminum, copper or other suitable metal materials or ceramic materials. In some embodiments, the thermal conductivity of the heat-dissipating device 320 is greater than the thermal conductivity of the thermal interface material layer 310 and the thermal conductivity of the insulating encapsulant 400. For instance, the heat-dissipating device 320 may include a heat sink. A higher thermal conductivity and higher thermal diffusivity of the material of the heat-dissipating device 320 as well as a greater heat-dissipating area, a better heat dissipation efficiency of the heat-dissipating device 320 is. A material with poor thermal conductivity is not used in the heat conduction pathway from the first chip 210 to the heat-dissipating device 320. Therefore, the thermal resistance between the first chip 210 and the heat-dissipating device 320 is low, such that the chip package 10 has high heat dissipation efficiency.

In some embodiments, thermal blocks 330 may be optionally disposed in the thermal interface material layer 310. For instance, the thermal blocks 330 may include a material with a higher thermal conductivity such as metal, ceramic, or other suitable materials to improve the heat dissipation performance of the heat dissipation structure 300. In some embodiments, the shape of the thermal blocks 330 includes, for instance, a circle, cylinder, square column, or the like, but the embodiments of the disclosure are not limited thereto. In other embodiments, the thermal blocks 330 may be omitted in the thermal interface material layer 310 so that the thermal blocks 330 are represented by a dash line in the figures.

The insulating encapsulant 400 encapsulates the first chip 210, the heat dissipation structure 300, and the chip pad 110 and the inner lead 120a of the lead frame 100, and the outer lead 120b is exposed to the outside the insulating encapsulant 400. Accordingly, the chip package 10 may be electrically connected to other electronic devices via the outer lead 120b. The material of the insulating encapsulant 400 may include an insulating material such as epoxy resin, or the like. The chip package 10 shown in FIG. 1A and FIG. 1B further includes a second chip 220. The second chip 220 is located on the inner lead 120a of the lead frame 100 and is encapsulated in the insulating encapsulant 400. In other words, the level of the first chip 210 is between the level of the second chip 220 and the level of the heat dissipation structure 300. The second chip 220 may be mounted on the lead frame 100 via the connecting material 222, and the connecting material 222 may be the same or similar material as the connecting material 212, and the embodiments of the disclosure are not limited thereto.

The second chip 220 may be electrically connected to the first chip 210 via the lead frame 100. In some embodiments, the function of the second chip 220 may be different from the function of the first chip 210. For instance, the second chip 220 is a driver chip driving the operation of the first chip 210. In other embodiments, the second chip 220 may be a control chip electrically connected to the first chip 210 via conductive wires to control the operation of the first chip 210. In some embodiments, the second chip 220 may be electrically connected to the inner lead 120a by forming conductive wires via a wire bonding process. In other embodiments, the second chip 220 may be electrically connected to the lead frame 100 via a flip-chip process. By combining the first chip 210 and the second chip 220 in the chip package 10, an integrated power module with small volume is formed.

In the present embodiment, the heat generated during the operation of the first chip 210 may be rapidly conducted to the outside of the chip package 10 to be dissipated via a heat conduction pathway formed by the heat dissipation structure 300 disposed on the second surface 114 of the chip pad 110. In comparison to a traditional direct bond copper (DBC) ceramic substrate and a direct plated copper (DPC) ceramic substrate which may be used as a heat dissipation pathway in an integrated power module, the chip package 10 of the present embodiment has the advantages of simple process and reduced manufacturing cost, and by using the heat dissipation structure 300 as a heat dissipation pathway, thermal resistance may be improved by 30% or more.

Second Embodiment

Figure 2:
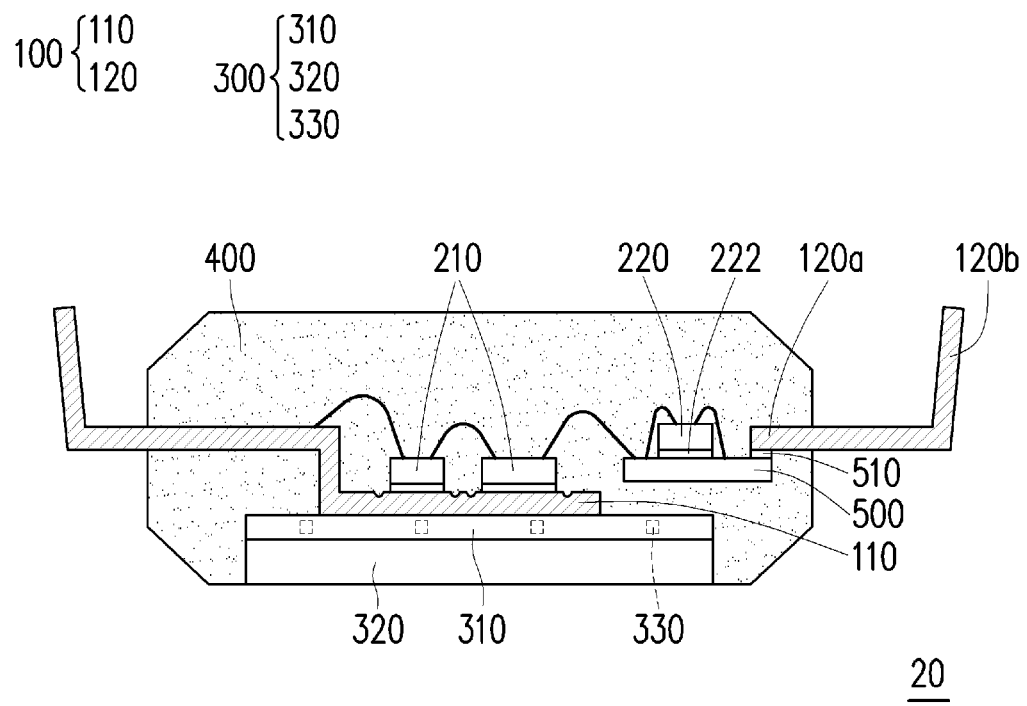
FIG. 2 is a schematic cross-section of a chip package according to the second embodiment of the disclosure.

FIG. 2 is a schematic cross-section of a chip package according to the second embodiment of the disclosure. Referring to FIG. 2, a chip package 20 of the present embodiment is similar to the chip package 10 of the first embodiment, and the same or similar reference numerals represent the same or similar components, and therefore the components in FIG. 1A and FIG. 1B are not repeated herein. The difference between the chip package 20 of the present embodiment and the chip package 10 of the first embodiment is that, the chip package 20 further includes a printed circuit board (PCB) 500. For instance, the PCB 500 is located between the chip pad 110 of the lead frame 100 and the inner lead 120a of the lead 120. The PCB 500 may be connected to the inner lead 120a via a connecting material 510 and be spatially separated from the chip pad 110. For instance, the orthogonal projection area of the PCB 500 and the orthogonal projection area of the chip pad 110 are not overlapped each other. The orthogonal projection area of the PCB 500 may be partially overlapped with the orthogonal projection area of the heat dissipation structure 300. In some embodiments, the connecting material 510 may include a solder material or other suitable materials. The connecting material 510 formed on the PCB 500 may also be referred to as a solder joint.

In some embodiments, the second chip 220 is, for instance, located on the PCB 500 and may be electrically connected to the PCB 500 via a wire bonding process. The high layout density of the PCB 500 is conducive to dispose the second chip 220 (such as a driver chip or a control chip) on the PCB 500. In some embodiments, the material of the PCB 500 may include a thermal insulation material to block heat from being conducted to the second chip 220 and damaging the second chip 220. The conductive wire may also be formed between the first chip 210 and the PCB 500 to be electrically connected to the first chip 210 and the second chip 220. In other embodiments, the second chip 220 may be electrically connected to the PCB 500 via a flip-chip process. For instance, the second chip 220 and the connecting material 510 may be located on the same surface of the PCB 500.

Third Embodiment

Figure 3:
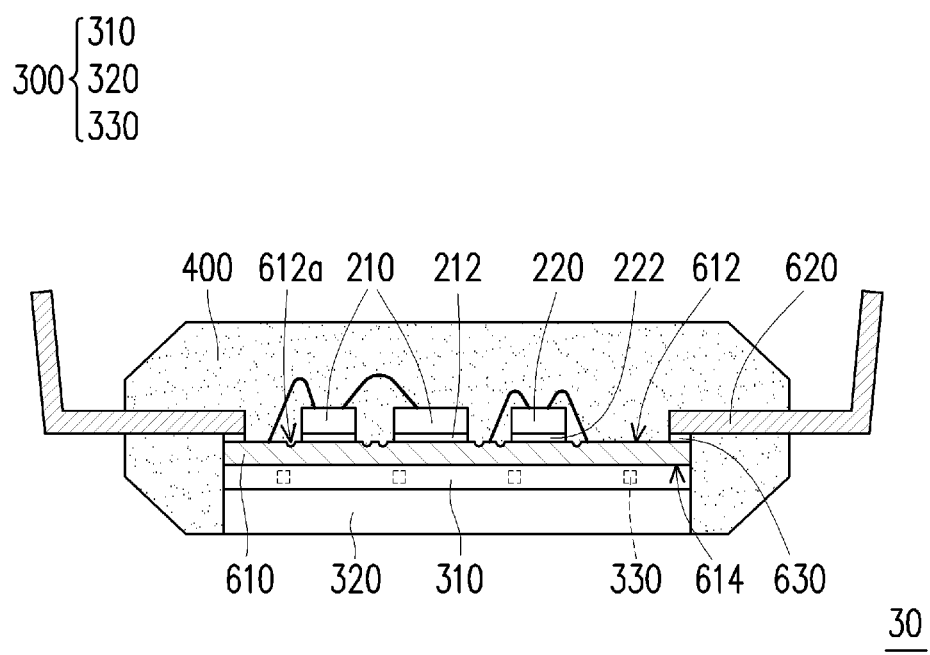
FIG. 3 is a schematic cross-section of a chip package according to the third embodiment of the disclosure.

FIG. 3 is a schematic cross-section of a chip package according to the third embodiment of the disclosure. Referring to FIG. 3, a chip package 30 of the present embodiment is similar to the chip package 10 of the first embodiment, and the same or similar reference numerals represent the same or similar components, and therefore the components in FIG. 1A and FIG. 1B are not repeated herein. The difference between the chip package 30 of the present embodiment and the chip package 10 of the first embodiment is that, the chip package 30 of the present embodiment includes a first lead frame 610 and a second lead frame 620 connected to the first lead frame 610. For instance, the first chip 210 and the second chip 220 are both disposed on a first surface 612 of the first lead frame 610, and the regions where the first chip 210 and the second chip 220 located may be regarded as the chip pads of the first lead frame 610. The heat dissipation structure 300 is disposed on a second surface 614 opposite to the first surface 612. The thermal interface material layer 310 may be in direct contact with the second surface 614. In some embodiments, the edges of the heat dissipation structure 300 may be aligned with the edges of the first lead frame 610.

The second lead frame 620 may be mounted on the first surface 612 of the first lead frame 610 via the connecting material 630. The connecting material 630 may include solder materials or other suitable materials. For instance, the first chip 210 and the second chip 220 are both disposed in the central region of the first surface 612 of the first lead frame 610, and the second lead frame 620 may be mounted in the peripheral region of the first surface 612 of the first lead frame 610. The grooves 612a are provided on the first surface 612 of the first lead frame 610. The grooves 612a may be similar to the groove 112a in the first embodiment, and therefore is not repeated herein. In some embodiments, the second chip 220 may also be disposed in a region defined by the grooves 612a as shown in FIG. 3.

Fourth Embodiment

Figure 4:
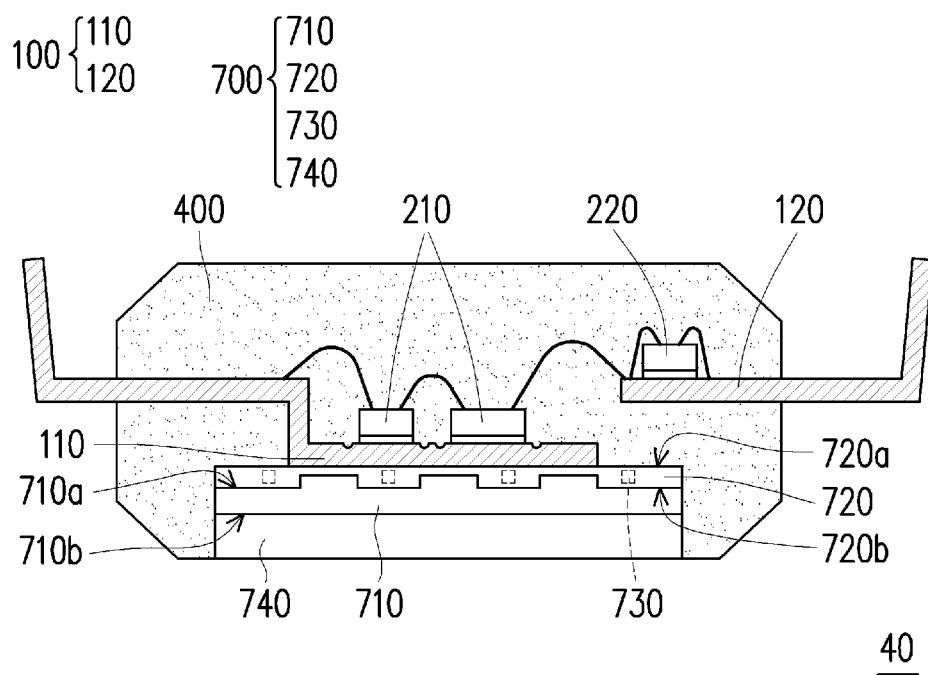
FIG. 4 is a schematic cross-section of a chip package according to the fourth embodiment of the disclosure.

FIG. 4 is a schematic cross-section of a chip package according to the fourth embodiment of the disclosure. Referring to FIG. 4, a chip package 40 of the present embodiment is similar to the chip package 10 of the first embodiment, and the same or similar reference numerals represent the same or similar components, and therefore the components in FIG. 1A and FIG. 1B are not repeated herein. The difference between the chip package 40 of the present embodiment and the chip package 10 of the first embodiment is that, a heat dissipation stack structure 700 of the chip package 40 includes a double thermal interface material layer, such as a first thermal interface material layer 710 and a second thermal interface material layer 720. The second thermal interface material layer 720 is located between the chip pad 110 of the lead frame 100 and the first thermal interface material layer 710.

The first thermal interface material layer 710 and the second thermal interface material layer 720 respectively include top surfaces 710a and 720a facing the first chip 210 and bottom surfaces 710b and 720b opposite to the top surfaces 710a and 720a. The second thermal interface material layer 720 covers the top surface 710a of the first thermal interface material layer 710. For instance, the top surface 720a of the second thermal interface material layer 720 is connected to the second surface 114 of the chip pad 110, and the bottom surface 720b of the second thermal interface material layer 720 is connected to the top surface 710a of the first thermal interface material layer 710. The area of the top surface 720a of the second thermal interface material layer 720 may be greater than the area of the bottom surface of the chip pad 110.

In some embodiments, the area of the top surface 710a of the first thermal interface material layer 710 is greater than the area of the top surface 720a of the second thermal interface material layer 720. In the cross-section shown in FIG. 4, the structures of the first thermal interface material layer 710 and the second thermal interface material layer 720 are corresponding concave-convex shapes. Therefore, the area of the top surface 710a of the first thermal interface material layer 710 is equal to the area of the bottom surface 720b of the second thermal interface material layer 720. In other embodiments, the cross-sections of the first thermal interface material layer 710 and the second thermal interface material layer 720 at the interface are, for instance, corresponding serrated shapes, wavy shapes, conical crosses, etc. Via the configuration above, the areas of the contact surfaces of the first thermal interface material layer 710 and the second thermal interface material layer 720 at the interface are increased, thereby increasing the heat dissipation performance of the heat dissipation structure 700.

In some embodiments, the thickness of the first thermal interface material layer 710 is greater than the thickness of the second thermal interface material layer 720. The aforementioned thicknesses are, for instance, maximum thicknesses or average thicknesses. In some embodiments, the volume of the first thermal interface material layer 710 is greater than the volume of the second thermal interface material layer 720. For instance, the edges of the first thermal interface material layer 710 may be aligned with the edges of the second thermal interface material layer 720. In other words, the orthogonal projection area of the first thermal interface material layer 710 may be completely overlapped with the orthogonal projection area of the second thermal interface material layer 720. In other embodiments, the orthogonal projection area of the second thermal interface material layer 720 may be smaller than the orthogonal projection area of the first thermal interface material layer 710 and located within the orthogonal projection area of the first thermal interface material layer 710.

The materials of the first thermal interface material layer 710 and the second thermal interface material layer 720 may be similar to that of the thermal interface material 310 in the first embodiment. In some embodiments, the material of the first thermal interface material layer 710 may be different from the material of the second thermal interface material layer 720. In other words, in terms of material properties (such as insulation, heat conduction, etc.), the first thermal interface material layer 710 is different from the second thermal interface material layer 720. For instance, the thermal conductivity of the first thermal interface material layer 710 may be greater than the thermal conductivity of the second thermal interface material layer 720. The thermal conductivity of the first thermal interface material layer 710 is, for instance, between 3 W/mK and 15 W/mK, and the thermal conductivity of the second thermal interface material layer 720 is, for instance, between 1 W/mK and 7 W/mK. In some embodiments, the viscosity of the first thermal interface material layer 710 is greater than the viscosity of the second thermal interface material layer 720. The insulation resistance (volume resistivity/dielectric resistivity) of the first thermal interface material layer 710 is smaller than the insulation resistance of the second thermal interface material layer 720. In some embodiments, the adhesion of the first thermal interface material layer 710 is smaller than the adhesion of the second thermal interface material layer 720.

In some embodiments, the heat dissipation stack structure 700 further includes thermal blocks 730. In the chip package 40 shown in FIG. 4, the thermal blocks 730 are located in the second thermal interface material layer 720. In some embodiments, the thermal blocks 730 may be located in the first thermal interface material layer 710. In some other embodiments, the thermal blocks 730 may be located in the first thermal interface material layer 710 and the second thermal interface material layer 720, respectively. The material of the thermal blocks 730 may be the same as or similar to that of the thermal blocks 330 in the first embodiment and is therefore not repeated herein. In other embodiments, the thermal blocks 730 in the chip package 40 may be omitted based on practical requirements and the embodiments of the disclosure are not limited thereto.

In some embodiments, the heat dissipation stack structure 700 further includes a heat-dissipating device 740. For instance, the heat-dissipating device 740 is overlapped with the first thermal interface material layer 710 and connected to the bottom surface 710b of the first thermal interface material layer 710. The edges of the heat-dissipating device 740 may be aligned with the first thermal interface material layer 710 and/or the second thermal interface material layer 720. In other embodiments, the width of the heat-dissipating device 740 may be greater than the widths of the first thermal interface material layer 710 and/or the second thermal interface material layer 720. Due to a large area in contact with the heat source, heat conduction may be facilitated such that heat may be dissipated to the outside via the heat dissipation structure 700.

Fifth Embodiment

Figure 5:
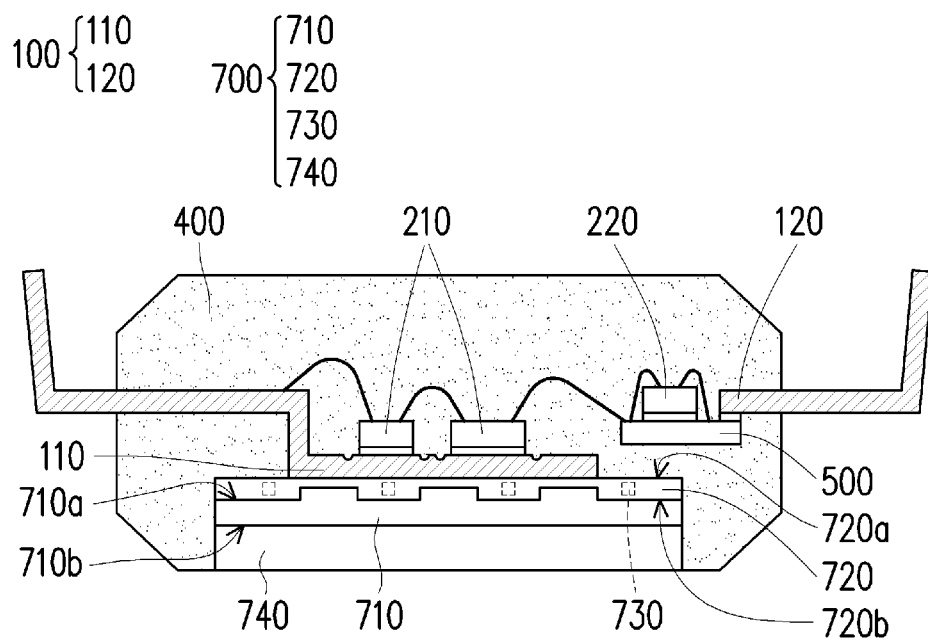
FIG. 5 is a schematic cross-section of a chip package according to the fifth embodiment of the disclosure.

FIG. 5 is a schematic cross-section of a chip package according to the fifth embodiment of the disclosure. Referring to FIG. 5, a chip package 50 of the present embodiment is similar to the chip package 40 of the fourth embodiment, and the same or similar reference numerals represent the same or similar components, and therefore the components in FIG. 4 are not repeated herein. The difference between the chip package 50 of the present embodiment and the chip package 40 of the fourth embodiment is that, the chip package 50 further includes a PCB 500 located between the chip pad 110 and the lead 120. The configuration of the PCB 500 is similar to that of the second embodiment and is therefore not repeated herein.

Sixth Embodiment

Figure 6:
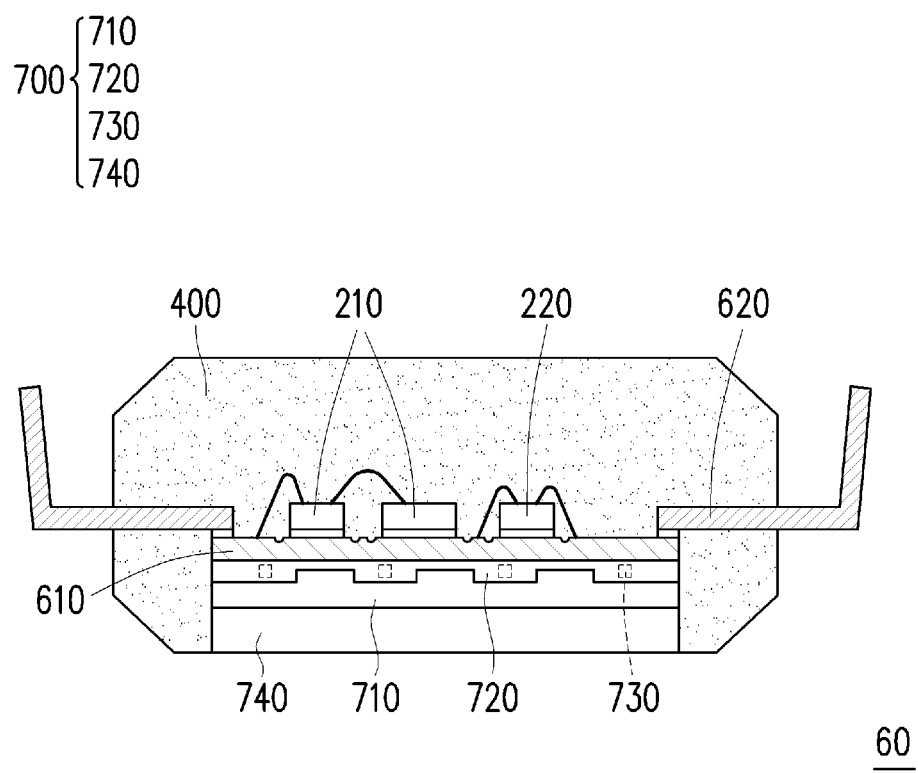
FIG. 6 is a schematic cross-section of a chip package according to the sixth embodiment of the disclosure.

FIG. 6 is a schematic cross-section of a chip package according to the sixth embodiment of the disclosure. Referring to FIG. 6, a chip package 60 of the present embodiment is similar to the chip package 40 of the fourth embodiment, and the same or similar reference numerals represent the same or similar components, and therefore the components in FIG. 4 are not repeated herein. The difference between the chip package 60 of the present embodiment and the chip package 40 of the fourth embodiment is that, the chip package 60 further includes a first lead frame 610 and a second lead frame 620 connected to the first lead frame 610. The configurations of the first lead frame 610 and the second lead frame 620 are similar to those of the third embodiment and are therefore not repeated herein.

Seventh Embodiment

Figure 7:
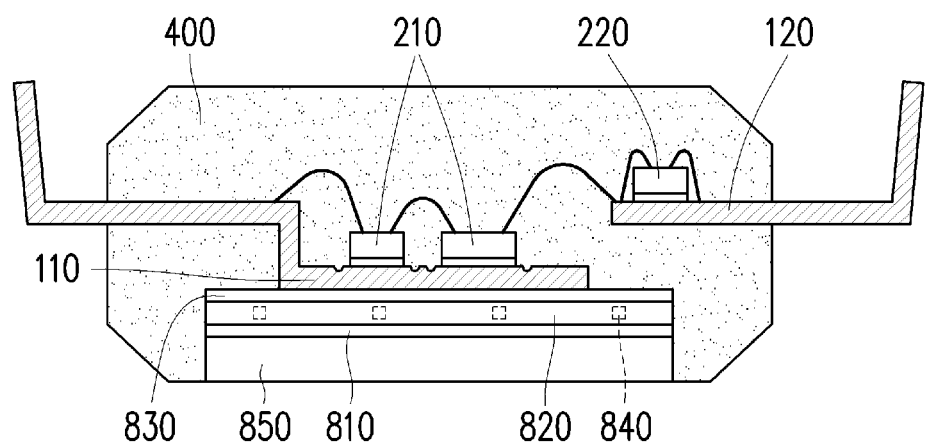
FIG. 7 is a schematic cross-section of a chip package according to the seventh embodiment of the disclosure.

FIG. 7 is a schematic cross-section of a chip package according to the seventh embodiment of the disclosure. Referring to FIG. 7, a chip package 70 of the present embodiment is similar to the chip package 10 of the first embodiment, and the same or similar reference numerals represent the same or similar components, and therefore the components in FIG. 1A and FIG. 1B are not repeated herein. The difference between the chip package 70 of the present embodiment and the chip package 10 of the first embodiment is that, a heat dissipation stack structure 800 of the chip package 70 includes a plurality of thermal interface material layers, such as a first thermal interface material layer 810, a second thermal interface material layer 820, and a third thermal interface material layer 830. For instance, the second thermal interface material layer 820 is stacked on the first thermal interface material layer 810, and the third thermal interface material layer 830 is stacked on the second thermal interface material layer 820. The third thermal interface material layer 830 is located between the chip pad 110 of the lead frame 100 and the second thermal interface material layer 820.

In some embodiments, the thickness of the second thermal interface material layer 820 is greater than the thickness of the first thermal interface material layer 810 and greater than the thickness of the third thermal interface material layer 830. The thickness of the first thermal interface material layer 810 is, for instance, the same as the thickness of the third thermal interface material layer 830. For instance, the thicknesses of the first thermal interface material layer 810 and the third thermal interface material layer 830 are between 10 µm and 50 µm, and the thickness of the second thermal interface material layer 820 is between 100 µm and 300 µm, but the disclosure is not limited thereto. In another embodiment, the thickness of the second thermal interface material layer 820 may be about 5 to 10 times the thickness of the first thermal interface material layer 810 or the third thermal interface material layer 830. In some embodiments, the edges of the first thermal interface material layer 810, the second thermal interface material layer 820, and the third thermal interface material layer 830 are aligned with one another. The surface area of the interface of the second thermal interface material layer 820 and the first thermal interface material layer 810 may be the same as the surface area of the interface of the second thermal interface material layer 820 and the third thermal interface material layer 830. For instance, the volume of the second thermal interface material layer 820 is greater than the volume of the first thermal interface material layer 810 and greater than the volume of the third thermal interface material layer 830. In other embodiments, the thickness of the first thermal interface material layer 810 may be greater or smaller than the thickness of the third thermal interface material layer 830. The volume of the first thermal interface material layer 810 may be greater or smaller than the volume of the third thermal interface material layer 830. The edges of the first thermal interface material layer 810, the second thermal interface material layer 820, and the third thermal interface material layer 830 may be misaligned. For instance, the cross-sectional shape of the edges is stepwise or uneven, and the embodiments of the disclosure are not limited thereto.

The materials of the first thermal interface material layer 810, the second thermal interface material layer 820, and the third thermal interface material layer 830 may be similar to that of the thermal interface material 310 in the first embodiment. In some embodiments, the material of the second thermal interface material layer 820 may be different from the material of the first thermal interface material layer 810 and the material of the third thermal interface material layer 830. In some embodiments, the materials of the first thermal interface material layer 810, the second thermal interface material layer 820, and the third thermal interface material layer 830 may respectively be different materials, and the insulation and heat conduction of the materials may also be different from one another. For instance, the thermal conductivity of the second thermal interface material layer 820 is greater than the thermal conductivity of the first thermal interface material layer 810 and greater than the thermal conductivity of the third thermal interface material layer 830. For instance, the thermal conductivity of the second thermal interface material layer 820 is between 3 W/mK and 15 W/mK. The thermal conductivity of the first thermal interface material layer 810 and/or the third thermal interface material layer 830 is, for instance, between 1 W/mK and 7 W/mK. In some embodiments, the viscosity of the second thermal interface material layer 820 is greater than the viscosity of the first thermal interface material layer 810 and greater than the viscosity of the third thermal interface material layer 830. In some embodiments, the adhesion of the second thermal interface material layer 820 is smaller than the adhesion of the first thermal interface material layer 810 and smaller than the adhesion of the third thermal interface material layer 830.

In some embodiments, the heat dissipation stack structure 800 further includes thermal blocks 840. For instance, the thermal blocks 840 may be located in at least one of the first thermal interface material layer 810, the second thermal interface material layer 820, and the third thermal interface material layer 830. In the chip package 70 shown in FIG. 7, the thermal blocks 840 are located in the second thermal interface material layer 820. In some embodiments, the thermal blocks 840 may be located in the first thermal interface material layer 810 and/or the second thermal interface material layer 820 and/or the third thermal interface material layer 830. The location of the thermal blocks 840 may be determined based on design requirement, and the embodiments of the disclosure are not limited thereto. In other embodiments, the thermal blocks 840 in the heat dissipation stack structure 800 may be omitted based on practical requirements and the embodiments of the disclosure are not limited thereto.

In some embodiments, the heat dissipation stack structure 800 further includes a heat-dissipating device 850. For instance, the heat-dissipating device 850 is overlapped with the first thermal interface material layer 810, and the first thermal interface material layer 810 is, for instance, located between the heat-dissipating device 850 and the second thermal interface material layer 820. The edges of the heat-dissipating device 850 may be aligned with the first thermal interface material layer 810 and/or the second thermal interface material layer 820 and/or the third thermal interface material layer 830. In other embodiments, the width of the heat-dissipating device 850 may be greater than the width(s) of the first thermal interface material layer 810 and/or the second thermal interface material layer 820 and/or the third thermal interface material layer 830. Due to a large area of contact with the heat source, heat conduction may be facilitated such that heat may be dissipated to the outside via the heat dissipation structure 800.

Eighth Embodiment

Figure 8:
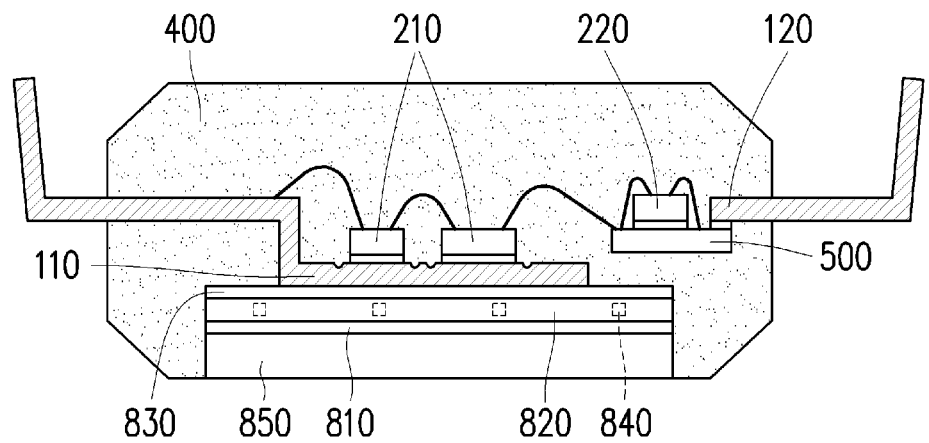
FIG. 8 is a schematic cross-section of a chip package according to the eighth embodiment of the disclosure.

FIG. 8 is a schematic cross-section of a chip package according to the eighth embodiment of the disclosure. Referring to FIG. 8, a chip package 80 of the present embodiment is similar to the chip package 70 of the seventh embodiment, and the same or similar reference numerals represent the same or similar components, and therefore the components in FIG. 7 are not repeated herein. The difference between the chip package 80 of the present embodiment and the chip package 70 of the seventh embodiment is that, the chip package 80 further includes a PCB 500 located between the chip pad 110 and the lead 120. The configuration of the PCB 500 is similar to that of the second embodiment and is therefore not repeated herein.

Ninth Embodiment

Figure 9:
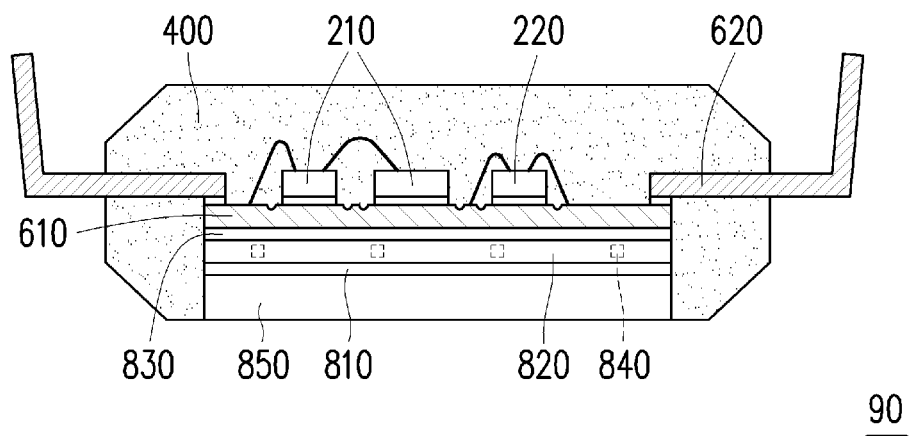
FIG. 9 is a schematic cross-section of a chip package according to the ninth embodiment of the disclosure.

FIG. 9 is a schematic cross-section of a chip package according to the ninth embodiment of the disclosure. Referring to FIG. 9, a chip package 90 of the present embodiment is similar to the chip package 70 of the seventh embodiment, and the same or similar reference numerals represent the same or similar components, and therefore the components in FIG. 7 are not repeated herein. The difference between the chip package 90 of the present embodiment and the chip package 70 of the seventh embodiment is that, the chip package 90 further includes the first lead frame 610 and the second lead frame 620 connected to the first lead frame 610. The configurations of the first lead frame 610 and the second lead frame 620 are similar to those of the third embodiment and are therefore not repeated herein.

Tenth Embodiment

Figure 10:
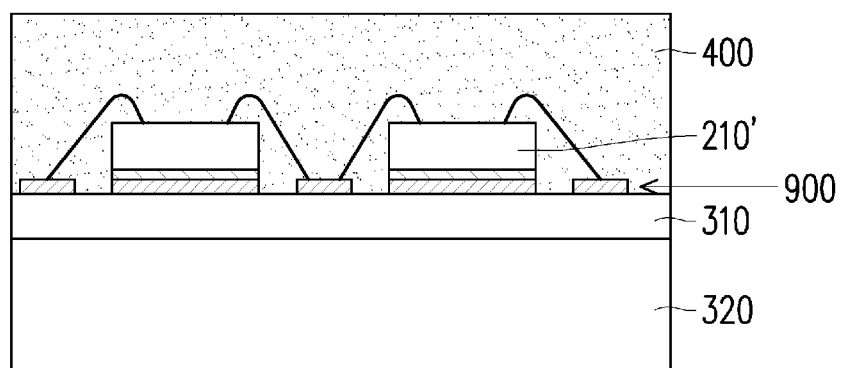
FIG. 10 is a schematic cross-section of a chip package according to the tenth embodiment of the disclosure.

FIG. 10 is a schematic cross-section of a chip package according to the tenth embodiment of the disclosure. In the present embodiment, the same or similar reference numerals in the embodiments above represent the same or similar components and are not repeated herein. Referring to FIG. 10, a chip package 95 of the present embodiment includes a heat-dissipating device 320, a thermal interface material layer 310, a patterned circuit layer 900, a chip 210', and an insulating encapsulant 400. The thermal interface material layer 310 may be disposed on the heat-dissipating device 320. In other embodiments, the thermal interface material layer 310 in the chip package 95 may also be replaced by the aforementioned heat dissipation stack structure 700 or 800.

The patterned circuit layer 900 may be disposed on the thermal interface material layer 310. The thermal interface material layer 310 is, for instance, located between the patterned circuit layer 900 and the heat-dissipating device 320. The chip 210' may be, for instance, disposed on the patterned circuit layer 900 via a flip-chip process and electrically connected to the patterned circuit layer 900. In other embodiments, the chip 210' may be electrically connected to the patterned circuit layer 900 via a wire bonding process. The chip 210' may include the aforementioned first chip 210 or the aforementioned second chip 220, and the embodiments of the disclosure are not limited thereto. The insulating encapsulant 400 is, for instance, disposed on the thermal interface material layer 310 and encapsulates the chip 210', the patterned circuit layer 900, and the thermal interface material layer 310. For instance, in a flip-chip embodiment, the insulating encapsulant 400 may include a molding underfill (MUF) to cover the thermal interface material layer 310 and be filled between the conductive bumps of the chip 210'. In other embodiments, the insulating encapsulant 400 may further cover the heat-dissipating device 320.

Based on the above, in an embodiment of the disclosure, by disposing the chip and the heat dissipation structure respectively at two opposite surfaces of the chip pad of the lead frame, the heat generated from the operation of the chip may be conducted to the outside via the lead frame and the heat dissipation structure. Such configuration has a shorter heat conduction distance and the heat dissipation structure has a higher thermal conductivity, such that the heat dissipation performance of the chip package is improved. The heat dissipation structure of an embodiment of the disclosure may include a single layer, double layer, or a plurality of layers of the thermal interface material to obtain high heat dissipation properties, such that the large amount of heat generated during the operation of the chip may be rapidly conducted via the thermal interface material and dissipated to the outside without conducting through the insulating encapsulant which has a poor heat conductivity. In an embodiment with a double layer of the thermal interface material, by increasing the area of the contact surfaces of the first thermal interface material layer and the second thermal interface material layer at the interface, the heat dissipation performance of the heat dissipation structure is increased. In an embodiment with a plurality of the thermal interface material, the second thermal interface material layer located between the first thermal interface material layer and the third thermal interface material layer has the highest thermal conductivity and the greatest thickness of the three. Via this configuration, the thermal conductivity of the heat dissipation structure is increased, such that the heat generated from the operation of the chip may be effectively dissipated from within the chip package to the outside. Moreover, by disposing thermal blocks in the thermal interface material layer, heat transfer properties of the heat dissipation structure are improved. In addition, the heat dissipation structure may further include a heat-dissipating device, and by disposing a thermal interface material between the heat-dissipating device and the chip, the heat dissipation efficiency of the chip package is increased.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A chip package, comprising:
   a chip;
   a chip carrier carrying the chip and electrically connected to the chip;
   a heat dissipation stack structure located at a side of the chip carrier opposite to a side carrying the chip, the heat dissipation stack structure comprising:
   a first thermal interface material layer;
   a second thermal interface material layer stacked on the first thermal interface material layer;
   a third thermal interface material layer stacked on the second thermal interface material layer and located between the chip carrier and the second thermal interface material layer, wherein a material of the second thermal interface material layer is different from a material of the first thermal interface material layer and a material of the third thermal interface material layer, the second thermal interface material layer completely separates the first thermal interface material layer from the third thermal interface material layer; and
   a heat-dissipating device overlapped with the first thermal interface material layer, wherein the first thermal interface material layer is interposed between the heat-dissipating device and the second thermal interface material layer, and the heat dissipation stack structure comprises a coterminous outer sidewall provided by a sidewall of the heat-dissipating device, a sidewall of the first thermal interface material layer, a sidewall of the second thermal interface material layer, and a sidewall of the third thermal interface material layer; and
   an insulating encapsulant encapsulating the chip, the heat dissipation stack structure, and the chip carrier and exposing a portion of the chip carrier.

2. The chip package of claim 1, wherein a thickness of the second thermal interface material layer is greater than a thickness of the first thermal interface material layer and greater than a thickness of the third thermal interface material layer.

3. The chip package of claim 1, wherein a volume of the second thermal interface material layer is greater than a volume of the first thermal interface material layer and greater than a volume of the third thermal interface material layer.

4. The chip package of claim 1, wherein a thermal conductivity of the second thermal interface material layer is greater than a thermal conductivity of the first thermal interface material layer and greater than a thermal conductivity of the third thermal interface material layer.

5. The chip package of claim 1, wherein a viscosity of the second thermal interface material layer is greater than a viscosity of the first thermal interface material layer and greater than a viscosity of the third thermal interface material layer.

6. The chip package of claim 1, wherein an adhesion of the second thermal interface material layer to the first thermal interface material layer is smaller than an adhesion of the third thermal interface material layer to the second thermal interface material layer.

7. The chip package of claim 1, wherein the heat dissipation stack structure further comprises:
   a thermal block located in at least one of the first thermal interface material layer, the second thermal interface material layer, and the third thermal interface material layer.

8. The chip package of claim 1, wherein the coterminous outer sidewall of the heat dissipation stack structure is in direct contact with the insulating encapsulant.

* * * * *